US006967427B2

(12) United States Patent
Yata

(10) Patent No.: US 6,967,427 B2
(45) Date of Patent: Nov. 22, 2005

(54) SURFACE ACOUSTIC WAVE DEVICE AND COMMUNICATION APPARATUS INCORPORATING THE SAME

(75) Inventor: Masaru Yata, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/389,909

(22) Filed: Mar. 18, 2003

(65) Prior Publication Data
US 2004/0000842 A1 Jan. 1, 2004

(30) Foreign Application Priority Data
Mar. 18, 2002 (JP) ........................ 2002-074559

(51) Int. Cl.[7] ..................... H03H 9/145; H03H 9/25
(52) U.S. Cl. ............... 310/313 D; 310/313 B; 310/313 C; 333/193; 333/194; 333/195; 333/196
(58) Field of Search ................... 333/193–196; 310/313, 313 B–313 D

(56) References Cited

U.S. PATENT DOCUMENTS

| 6,717,489 B2 * | 4/2004 | Takamine ............... 310/313 B |
| 6,720,842 B2 * | 4/2004 | Sawada ...................... 333/133 |
| 2003/0035557 A1 | 2/2003 | Takamine et al. |

FOREIGN PATENT DOCUMENTS

| JP | 55-051042 | 4/1980 | .......... C07C/87/52 |
| JP | 59-107620 | 6/1984 | |
| JP | 06-177697 | 6/1994 | .......... H03H/9/145 |
| JP | 06-204781 | 7/1994 | |
| JP | 06-276045 | 9/1994 | ............ H03H/7/42 |
| JP | 09-172342 | 6/1997 | .......... H03H/9/145 |
| JP | 11-145772 | 5/1999 | |
| JP | 11-251861 | 9/1999 | .......... H03H/9/145 |
| JP | 11-298295 | 10/1999 | .......... H03H/11/32 |
| JP | 2000-165203 | 6/2000 | .......... H03H/11/32 |
| JP | 2000-209061 | 7/2000 | .......... H03H/9/145 |
| JP | 2000-312125 | 11/2000 | .......... H03H/9/145 |
| JP | 2001-028530 | 1/2001 | ............ H03H/9/65 |
| JP | 2002-084165 | 3/2002 | ............ H03H/9/25 |
| JP | 2002-271168 | 9/2002 | ............ H03H/9/25 |

OTHER PUBLICATIONS

Yuichi Takamine et al.; "Surface Acoustic Wave Device"; U.S. Appl. No. 10/217,417, filed Aug. 14, 2002, currently pending.

* cited by examiner

Primary Examiner—Darren Schuberg
Assistant Examiner—J. Aguirrechea
(74) Attorney, Agent, or Firm—Keating & Bennett, LLP

(57) ABSTRACT

A surface acoustic wave filter device includes balanced signal terminals, and surface acoustic wave filters respectively connected to the balanced signal terminals, and at least one surface acoustic wave resonator connected between at least one of the balanced signal terminals and a ground terminal.

10 Claims, 20 Drawing Sheets

RELATIONSHIP BETWEEN QUALITY FACTOR Q OF SURFACE
ACOUSTIC WAVE RESONATOR AND AMPLITUDE BALANCE

SURFACE ACOUSTIC WAVE DEVICE AND COMMUNICATION APPARATUS INCORPORATING THE SAME

BACKGROUND OF THE INVENTION

1. Field of the Invention

The present invention relates to surface acoustic wave devices and, more particularly, to a surface acoustic wave device which improves the balance within the passband thereof, particularly an amplitude balance thereof, and to a communication apparatus incorporating the surface acoustic wave device.

2. Description of the Related Art

Rapid advances in the field of mobile telephones have achieved compact and light-weight designs. Along with technical advances, a plurality of functions are incorporated in a single component in accordance with efforts to reduce the number of components of the mobile telephone and to miniaturize the mobile telephone.

Surface acoustic wave filter devices for use in an RF stage in a mobile telephone have been actively studied to incorporate a balanced-to-unbalanced line-coupling function, or a so-called balun function. Such filter devices have been used, particularly, in GSM (Global System for Mobile Communications). Furthermore, such filter devices are likely to be used in PCS (Personal Communication Services) and DCS (Digital Communication System).

Japanese Unexamined Patent Application Publication 6-204781 (with publication date Jul. 22, 1994) and Japanese Unexamined Patent Application Publication 11-145772 (with publication date May 28, 1999) disclose surface acoustic wave filter devices having the balanced-to-unbalanced line-coupling function.

FIG. 17 is a plan view schematically illustrating a surface acoustic wave filter device having a balanced-to-unbalanced line-coupling function.

Referring to FIG. 17, a surface acoustic wave filter device 1R includes a first surface acoustic wave filter 100 provided on a piezoelectric substrate (not shown), and a second surface acoustic wave filter 200 having a phase different by 180° from a phase of the first surface acoustic wave filter 100.

The first surface acoustic wave filter 100 is a serially coupled three-IDT (interdigital transducer) resonator type surface acoustic wave filter including a center IDT 101, two IDTs 102 and 103 on both sides of the center IDT 101, and reflectors 104 and 105 with the two IDTs 102 and 103 interposed therebetween. The second surface acoustic wave filter 200 is different in phase by 180° from the first surface acoustic wave filter 100 with the polarity of electrodes 206 and 207 set to be opposite to the polarity of electrodes 106 and 107 in the first surface acoustic wave filter 100. Terminals 52 and 52 are balanced signal terminals, and a terminal 51 with which terminals 112 and 212 are electrically connected in parallel is an unbalanced signal terminal 51.

The filter having the balanced-to-unbalanced line-coupling function must satisfy a requirement that transmission characteristics within a passband of the filter from the unbalanced signal terminal to the two balanced signal terminals remain equal in amplitude but different in phase by 180°, and a requirement that transmission characteristics out of the passband of the filter from the unbalanced signal terminal to the two balanced signal terminals remain equal in amplitude and in phase.

An amplitude balance and a phase balance are defined as below. A surface acoustic wave filter device having the balanced-to-unbalanced line-coupling function is now considered as a three-port device with the port 1 defining as an unbalanced signal input terminal, and the ports 2 and 3 respectively defining the balanced signal output terminals.

Amplitude balance=|A|

$A=|20 \log S21|-|20 \log S31|$     Equation 1

Phase balance=|B−180|

$B=|\angle S21-\angle S31|$     Equation 2 where S21 and S31 are elements of a scattering matrix into which the three-port device is expressed, and respectively represent transmission characteristic between the port 2 and the port 1, and the transmission characteristic between the port 3 and the port 1.

Ideally, the amplitude balance is 0 dB and the phase balance is 0 degree within the passband of the filter, and the amplitude balance is 0 dB and the phase balance is 180 degrees out of the passband of the filter.

A deviation from the ideal balance occurs in the conventional surface acoustic wave filter device 1R shown in FIG. 17, and the degree of deviation becomes a problem in the actual operation of the filter.

In the first surface acoustic wave filter 100, electrodes 107, 108, and 110 having electrode fingers at each of borders between the three IDTs 101, 102, and 103 are grounded. In the second surface acoustic wave filter 200, an electrode 206 having electrode fingers at each of borders with the IDTs 201, 202 and 203 is connected to the signal terminal 51, and electrodes 208 and 210 having electrode fingers at each of borders with the IDT 210 are grounded.

Since grounded electrode fingers are arranged side by side at the borders of the IDTs in the first surface acoustic wave filter 100, no surface acoustic wave is excited in this portion. On the other hand, since the electrode fingers connected to the signal terminal and the grounded electrode fingers are arranged side by side at the borders of the IDTs in the second surface acoustic wave filter 200, a surface acoustic wave is excited.

The number of electrode fingers in the IDT 101 in the first surface acoustic wave filter 100 is different from the number of electrode fingers in the IDT 201 in the second surface acoustic wave filter 200. The first surface acoustic wave filter 100 and second surface acoustic wave filter 200 have substantially different filter characteristics from each other.

The difference in the filter characteristics is a major cause of significant degradation of the balance, particularly within the passband.

Japanese Unexamined Patent Application Publication No. 59-107620 (with publication date Jun. 21, 1984) discloses a technique in which an impedance element including a resistor, a coil, and a capacitor is connected to a balanced signal terminal to improve balance.

In practice, it is difficult to include a desired impedance element within a surface acoustic wave filter device. If such an impedance element is attached as an external element, an extra mounting area is required and costs are increased accordingly.

SUMMARY OF THE INVENTION

To overcome the problems described above, preferred embodiments of the present invention provide a surface acoustic wave filter device having a balanced-to-unbalanced line-coupling function having greatly improved balance, in particular, a greatly improved amplitude balance without using an impedance element, and also provide a communication apparatus incorporating the surface acoustic wave filter device.

In one preferred embodiment of the present invention, a surface acoustic wave device includes balanced signal terminals, a surface acoustic wave filter connected to the balanced signal terminals, and at least one surface acoustic wave resonator connected between at least one of the balanced signal terminals and a ground terminal.

In another preferred embodiment of the present invention, a surface acoustic wave device includes balanced signal terminals, a surface acoustic wave filter connected to the balanced signal terminals, and at least one surface acoustic wave resonator connected in parallel to at least one of the balanced signal terminals.

In the above-described arrangements, the balance of the filter is greatly improved by providing the surface acoustic wave resonator on the piezoelectric substrate instead of providing an impedance element. Specifically, the amplitude balance is greatly improved by reducing a difference between insertion losses.

The above-described arrangements eliminate the need to provide the impedance element within the surface acoustic wave device, and the need to connect an external impedance element. The surface acoustic wave resonator is also preferably formed in the same photolithographic step in which a surface acoustic wave filter section is formed.

The above-described arrangements produce a surface acoustic wave filter device having outstanding amplitude balance, in particular, the amplitude balance within the passband. The surface acoustic wave filter device outperforms the conventional devices in terms of costs and dimensions.

Preferably, a resonance point of the surface acoustic wave resonator falls within a passband of the surface acoustic wave filter.

Preferably, the resonance point of the surface acoustic wave resonator is approximately equal to or in the vicinity of a frequency at which an amplitude balance of the surface acoustic wave filter is deviated from an ideal value thereof, within the passband of the surface acoustic filter.

With this arrangement, the resonance point of the surface acoustic wave resonator is approximately equal to or in the vicinity of the frequency out of an ideal value (0 dB) of the amplitude balance.

Even if a difference between insertions losses at the two balanced signal terminals is increased at a frequency, a surface acoustic wave resonator having a response frequency equal to that frequency may be electrically connected in parallel with one of the balanced signal terminals.

The insertion loss of the balanced signal terminal, to which the surface acoustic wave resonator is connected in parallel, is increased in the vicinity of the frequency, thereby being close to the insertion loss of the other balanced signal terminal. The amplitude balance is thus greatly improved by reducing the difference between the two balanced signal terminals.

Preferably, the surface acoustic wave resonator is connected to the balanced signal terminals having a smaller insertion loss.

If there is a difference between the insertion losses of the two balanced signal terminals in the surface acoustic wave filter device, the surface acoustic wave resonator is preferably connected to the one of the balanced signal terminals having a smaller insertion loss.

Preferably, a quality factor Q of the surface acoustic wave resonator is preferably about 160 or less.

The quality factor Q of the surface acoustic wave resonator connected to at least one of the balanced signal terminals of the surface acoustic wave filter is preferably about 160 or less. With this arrangement, the amplitude balance is greatly improved. Even when a plurality of surface acoustic wave resonators are connected in parallel to the balanced signal terminal, the same advantages are provided if the overall quality factor Q of the plurality of surface acoustic wave resonators is preferably equal to or less than 160.

Preferably, the surface acoustic wave device of various preferred embodiments of the present invention has a balance-unbalance converting function.

This arrangement is appropriate for use as a surface acoustic wave filter device having a balanced-to-unbalanced line-coupling function.

A communication apparatus of another preferred embodiment of the present invention includes the above-described surface acoustic wave filter device.

In the communication apparatus including the surface acoustic wave filter device having the balanced signal terminals, the surface acoustic wave filter device includes the surface acoustic wave resonator on the piezoelectric substrate to reduce the difference between the insertion losses of the balanced signal terminals to greatly improve the amplitude balance.

The surface acoustic wave filter device does not need an internal impedance element or an external impedance element connected thereto. The surface acoustic wave resonator is preferably also formed in the same lithographic step in which a surface acoustic wave filter section is formed. The surface acoustic wave filter device outperforms the conventional devices in terms of costs and dimensions.

The incorporation of the surface acoustic wave filter device provides a compact and low-cost communication apparatus having excellent filter characteristic.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be discussed with reference to FIGS. 1 through 16.

As will be discussed, a surface acoustic wave filter device (a surface acoustic wave device) of the present invention is preferably used, for example, as a DCS (Digital Communication System) receiving filter, although the present invention is in no way limited thereto.

First Preferred Embodiment

Figure 1:
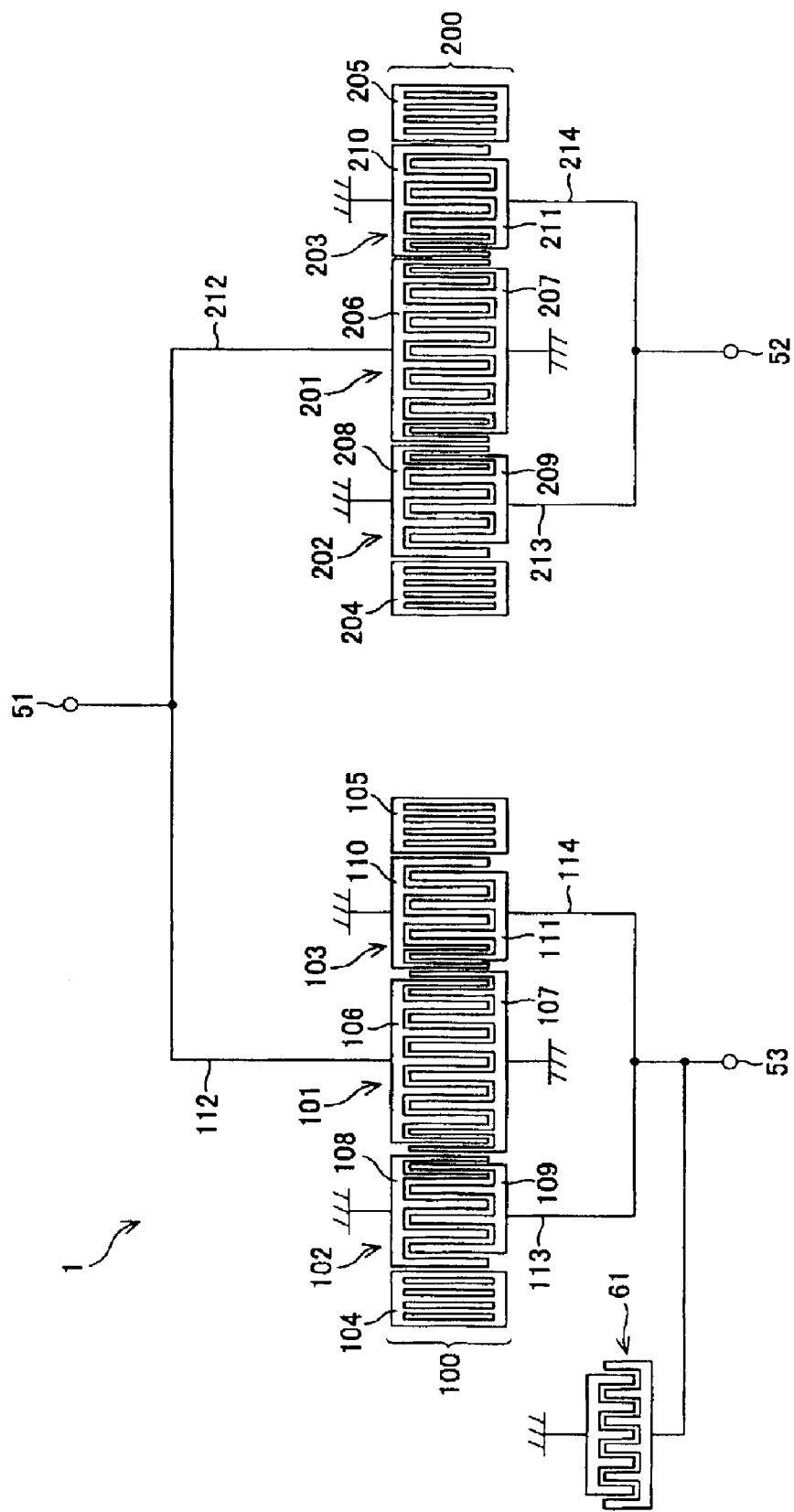
FIG. 1 is a plan view illustrating a surface acoustic wave filter device in accordance with a first preferred embodiment of the present invention.

FIG. 1 is a plan view illustrating a surface acoustic wave filter device 1 in accordance with one preferred embodiment of the present invention.

As shown, the surface acoustic wave filter device 1 includes, on a 40±5° Y-cut, X-propagating LiTaO$_3$ substrate (not shown), a first serially coupled resonator type surface acoustic wave filter (hereinafter referred to as a "first surface acoustic wave filter") 100 formed of Al electrodes, and a second serially coupled resonator type surface acoustic wave filter (hereinafter referred to as a "second surface acoustic wave filter") 200 different in phase by 180° from the first surface acoustic wave filter 100, and a surface acoustic wave resonator 61.

The first surface acoustic wave filter 100 is terminated with a signal terminal 112 at one end thereof, and is terminated with signal terminals 113 and 114 at the other end thereof. The second surface acoustic wave filter 200 is terminated with a signal terminal 212 at one end thereof, and is terminated with signal terminals 213 and 214 at the other end thereof. The signal terminals 112 and 212 are connected in parallel with an unbalanced signal terminal 51. The signal terminals 113 and 114 are connected in parallel with a balanced signal terminal 53, and the signal terminals 213 and 214 are connected in parallel with a balanced signal terminal 52. Furthermore, the surface acoustic wave resonator 61 is electrically connected in parallel with the balanced signal terminal 53.

The first surface acoustic wave filter 100 includes the IDT (interdigital transducer) 101, IDTs 102 and 103 sandwiching the IDT 101 therebetween, and reflectors 104 and 105 sandwiching the IDTs 102 and 103 therebetween. A pitch of several electrode fingers is preferably narrower (narrow-pitched electrode fingers) where the IDTs 101 and 102 are adjacent to each other (namely, an end portion of the IDT 101 next to the IDT 102 and an end portion of the IDT 102 next to the IDT 101), where the IDTs 101 and 103 are adjacent to each other (namely, an end portion of the IDT 101 next to the IDT 103, and an end portion of the IDT 103 next to the IDT 101), than a pitch of electrode fingers in the remaining portions (see FIG. 1). As shown, the number of electrode fingers is less than the actual number to simplify the drawing.

The second surface acoustic wave filter 200 includes the electrodes 206 and 207 in the center IDT 201 opposite in polarity from the electrodes 106 and 107 in the IDT 101 of the first surface acoustic wave filter 100. With this arrangement, the first and second surface acoustic wave filters 100 and 200 are different in polarity by 180°.

A resonance point of the surface acoustic wave resonator 61 is preferably approximately equal to or in the vicinity of a frequency, at which an amplitude balance of the first surface acoustic wave filter 100 is deviated from an ideal value thereof, within the passband of the first surface acoustic wave filter 100.

In this arrangement, the insertion loss at the balanced signal terminal 53 connected to the surface acoustic wave resonator 61 is increased in the vicinity of a frequency where an insertion loss difference between the balanced signal terminals 52 and 53 is large. The insertion loss of the balanced signal terminal 53 is thus set to be close to that of the balanced signal terminal 52. A reduction in the insertion loss difference between the two balanced signal terminals 52 and 53 leads to an improvement of the amplitude balance of the surface acoustic wave filter device 1.

Second Preferred Embodiment

Figure 2:
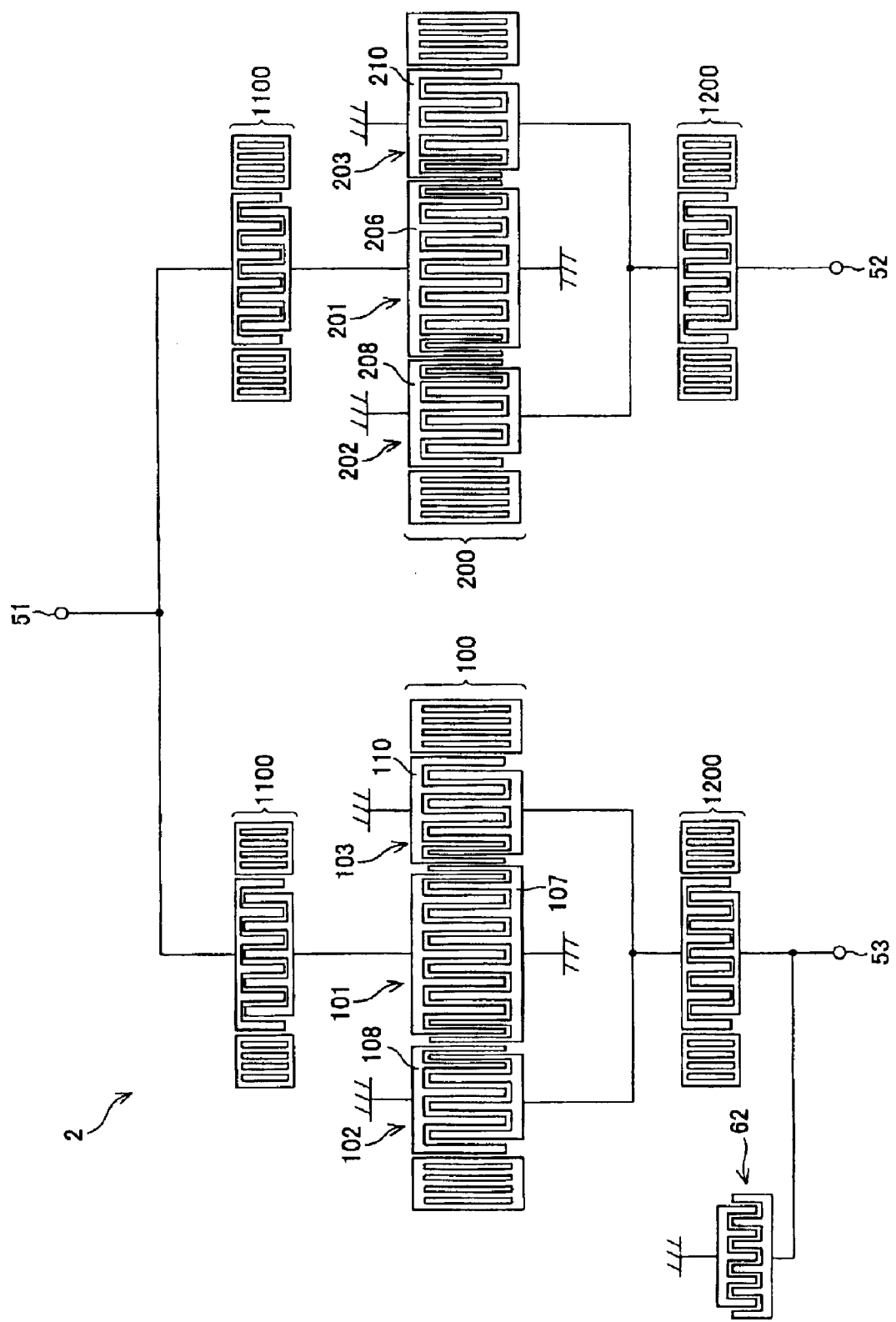
FIG. 2 is a plan view illustrating a surface acoustic wave filter device in accordance with a second preferred embodiment of the present invention.

FIG. 2 is a plan view illustrating a surface acoustic wave filter device 2 in accordance with a second preferred embodiment of the present invention. For convenience of explanation, components which are identical to those discussed in connection with the first preferred embodiment are designated with the same reference numerals and the discussion thereof is omitted here.

Referring to FIG. 2, the surface acoustic wave filter device 2 includes two first traps 1100, one first trap 1100 electrically connected in series between an unbalanced signal terminal 51 and a first surface acoustic wave filter 100, and the other first trap 1100 electrically connected in series between the unbalanced signal terminal 51 and a second surface acoustic wave filter 200. The surface acoustic wave filter device 2 further includes two second traps 1200, one second trap 1200 electrically connected in series between a balanced signal terminal 53 and the first surface acoustic wave filter 100, and the other second trap 1200 electrically connected in series between a balanced signal terminal 52 and the second surface acoustic wave filter 200. Like the surface acoustic wave filter device 1, the surface acoustic wave filter device 2 includes a surface acoustic wave resonator 62 electrically connected in parallel to the balanced signal terminal 53.

The first and second traps 1100 and 1200 are arranged to produce attenuation out of the passband. The use of the first and second traps 1100 and 1200 has no effect on improvements in the balances.

Design values of the surface acoustic wave filter device 2 are listed below. The surface acoustic wave filter device 1 also preferably has the same design values.

(1) First and Second Surface Acoustic Wave Filters 100 and 200

Let $\lambda I2$ represent the wavelength of surface acoustic wave determined by the pitch of the narrow-pitched electrode fingers (in the borders of the IDTs 101 and 102, and of the IDTs 101 and 103), and $\lambda I1$ represent the wavelength of surface acoustic wave determined by the pitch of the electrode fingers in the remaining portions of the filters.

Interdigital width W: about 44.3 $\lambda I$
    Number of IDT electrode fingers (in the order of IDTs 102/101/103):
    23(3)/(3)35(3)/(3)23

Note that the numbers in parenthesis represent the number of narrow-pitched electrode fingers having a narrow wavelength ($\lambda 2$).

Figure 3:
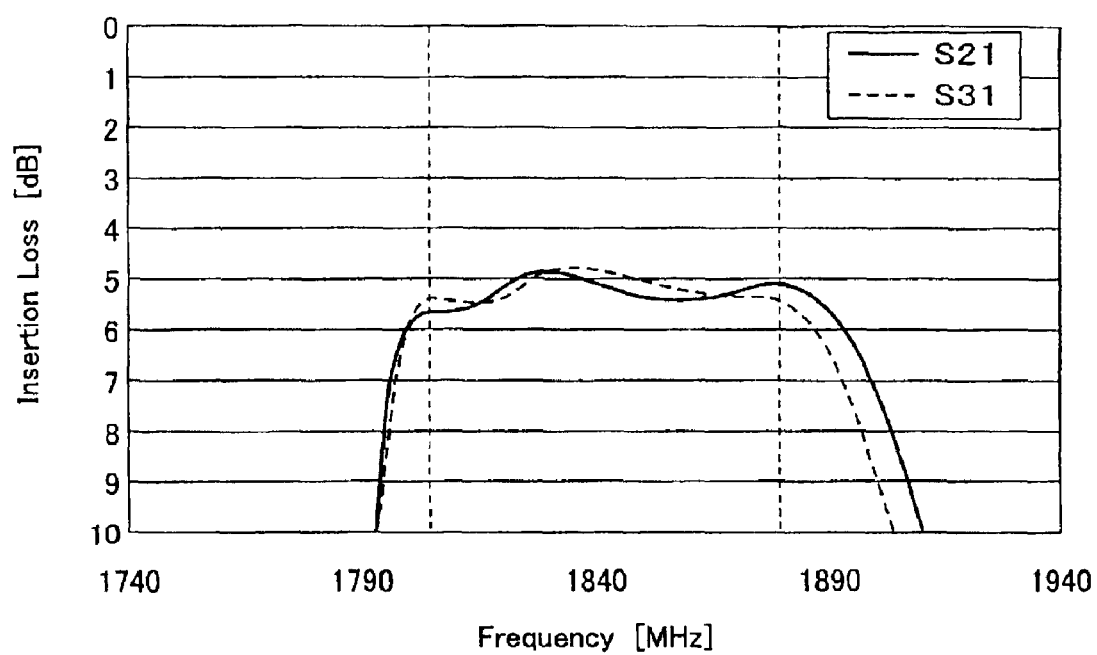
FIG. 3 is a graph plotting insertion losses at balanced signal terminals of the surface acoustic wave filter device illustrated in FIG. 2.
Figure 4:
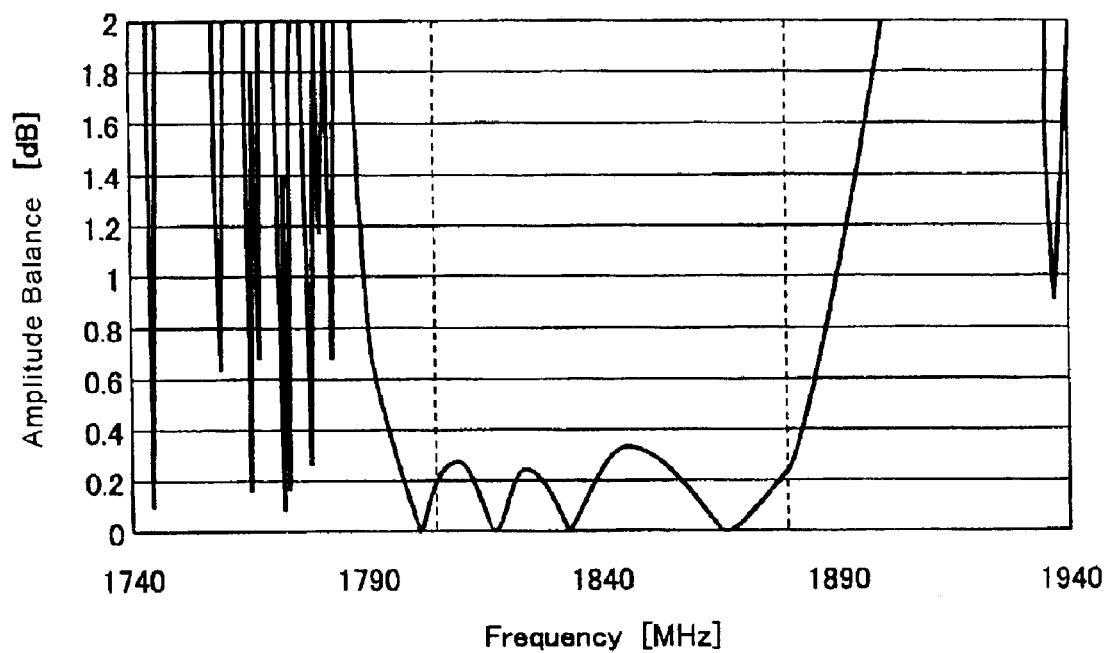
FIG. 4 is a graph plotting an amplitude balance of the surface acoustic wave filter device illustrated in FIG. 2.

Wavelength of IDT $\lambda 1$: about 2.14 $\mu$m
    Wavelength of IDT $\lambda 2$: about 1.94 $\mu$m
    Wavelength of reflector $\lambda R$: about 2.18 $\mu$m
    Number of electrode fingers of reflectors: 150
    Distance between IDT ($\lambda 1$) and IDT ($\lambda 2$): about 0.25 $\lambda I1$+about 0.25 $\lambda I2$
    Distance between IDT ($\lambda 2$) and IDT ($\lambda 2$): about 0.50 $\lambda I2$
    Distance between IDT ($\lambda 1$) and reflector: about 0.50 $\lambda I1$
    Duty factor of IDT ($\lambda 1$): about 0.63
    Duty factor of IDT ($\lambda 2$): about 0.63
    Duty factor of reflector: about 0.57
    Thickness of electrode: about 0.096 $\lambda I1$ (2) First trap 1100
    Interdigital width W: about 36.6 $\lambda I$
    Number of pairs of electrodes in IDT: 120
    Wavelength of IDT $\lambda I$: about 2.05 $\mu$m
    Wavelength of reflector $\lambda R$: about 2.05 $\mu$m
    Number of electrodes of reflector: 30
    Distance between IDT and reflector: about 0.50 $\lambda I$
    Duty factor of IDT: about 0.60
    Duty factor of reflector: about 0.60
    Thickness of electrodes: about 0.099 $\lambda I$ (3) Second trap 1200
    Interdigital width W: about 19.2 $\lambda I$
    Number of pairs of electrodes in IDT: 120
    Wavelength of IDT $\lambda I$: about 2.08 $\mu$m
    Wavelength of reflector $\lambda R$: about 2.08 $\mu$m
    Number of electrodes of reflector: 30
    Distance between IDT and reflector: about 0.50 $\lambda I$
    Duty factor of IDT: about 0.60
    Duty factor of reflector: about 0.60
    Thickness of electrodes: about 0.099 $\lambda I$ (4) Surface Acoustic Wave Resonator 62 (61)
    Interdigital width W: about 2.3 $\lambda I$
    Number of pairs of electrodes in IDT: 12
    Wavelength of IDT $\lambda I$: about 2.11 $\mu$m
    Wavelength of reflector $\lambda R$: about 2.11 $\mu$m
    Number of electrodes of reflector: 0
    Duty factor of IDT: about 0.60
    Thickness of electrodes: about 0.097 $\lambda I$ FIG. 3 is a graph plotting insertion losses between the unbalanced signal terminal 51 and the balanced signal terminals 52 and 53 in the surface acoustic wave filter device 2. As shown, S21 and S31 respectively represent the insertion loss between the unbalanced signal terminal 51 and the balanced signal terminal 52, and the insertion loss between the unbalanced signal terminal 51 and the balanced signal terminal 53. FIG. 4 is a graph plotting an amplitude balance of the surface acoustic wave filter device 2.

Figure 18:
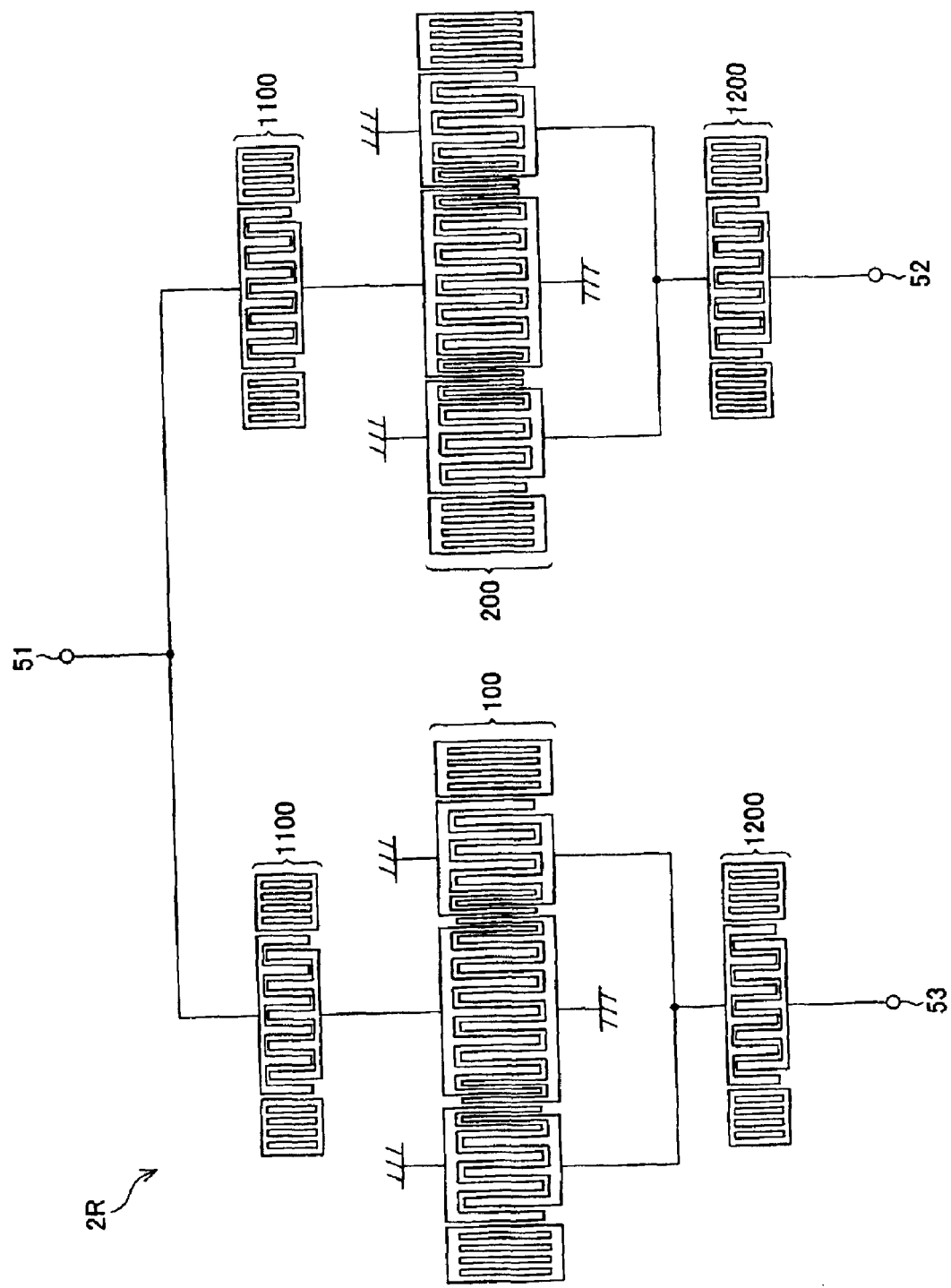
FIG. 18 is a plan view of a comparative surface acoustic wave filter device for comparison with the surface acoustic wave filter device of FIG. 2.

The surface acoustic wave filter device 2 is now compared with a surface acoustic wave filter device 2R shown in FIG. 18 as a comparative example. The surface acoustic wave filter device 2R is identical in construction to the surface acoustic wave filter device 2 except that the surface acoustic wave resonator 62 electrically connected in parallel with the balanced signal terminal 53 is not included.

Figure 19:
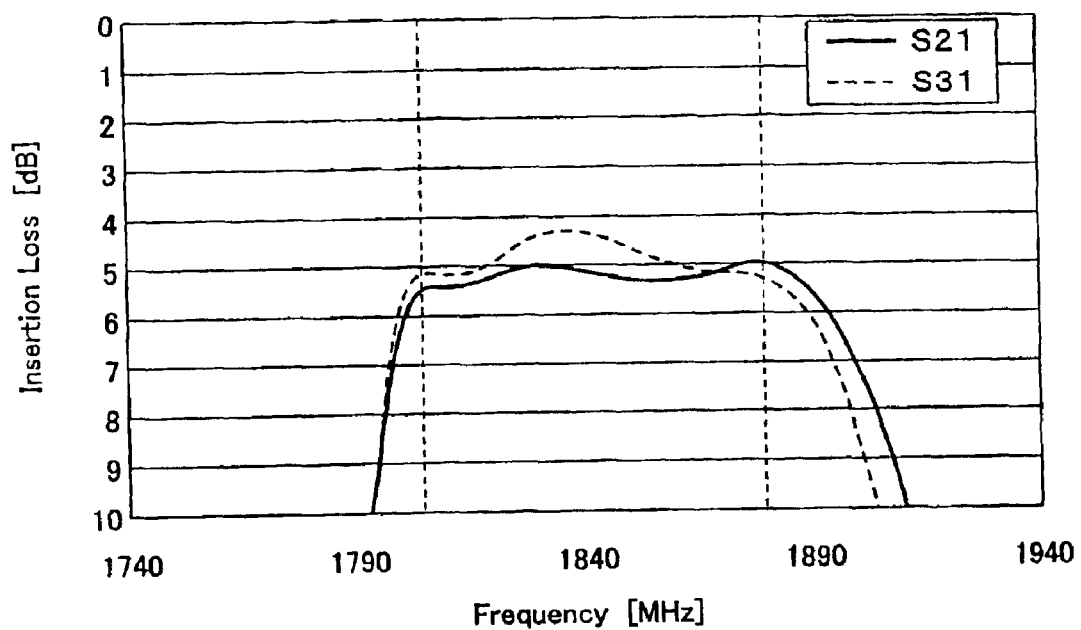
FIG. 19 is a graph plotting transmission characteristics at balanced signal terminals of the surface acoustic wave filter device of FIG. 18.
Figure 20:
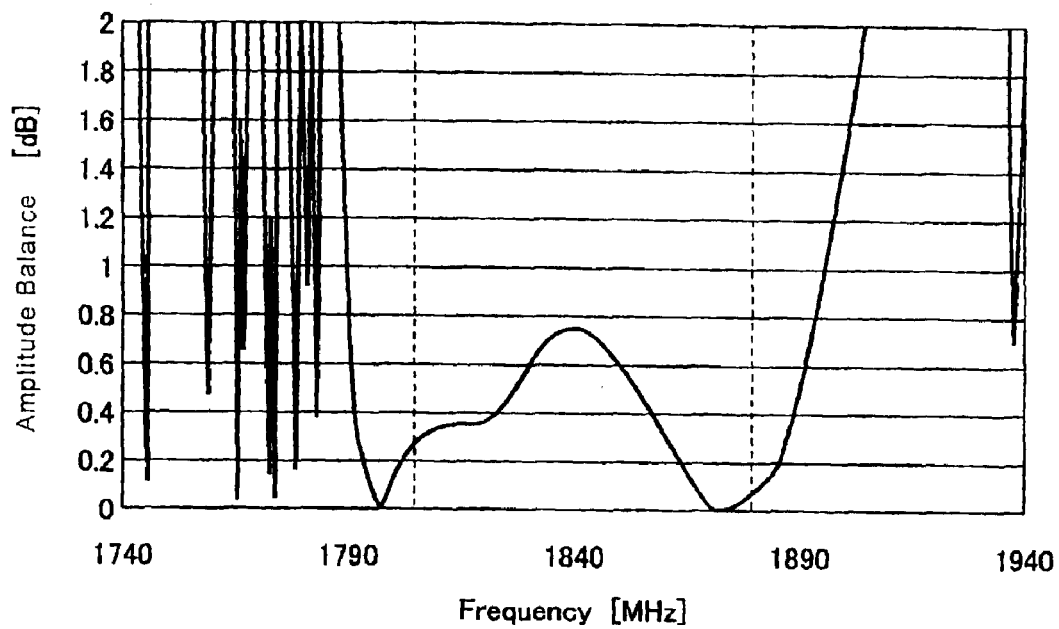
FIG. 20 is a graph plotting an amplitude balance of the surface acoustic wave filter device of FIG. 18.

FIG. 19 is a graph plotting insertion losses between the unbalanced signal terminal 51 and each of the balanced signal terminals 52 and 53 in the surface acoustic wave filter device 2R. FIG. 20 is a graph plotting an amplitude balance of the surface acoustic wave filter device 2R.

The comparison of FIG. 3 with FIG. 19 shows that the surface acoustic wave filter device 2 provides a reduced insertion loss difference at S21 and S31 within the passband thereof. As a result, the amplitude balance is greatly improved as shown in FIGS. 4 and 20. The amplitude balance is particularly improved within a frequency range of 1805 MHz to 1880 MHz (as indicated by dotted broken lines), which is a DCS receiving band. In the vicinity of 1830 MHz, the amplitude balance is improved from about 0.8 dB to about 0.35 dB.

The operation of the surface acoustic wave filter device 2 and surface acoustic wave filter device 2R will be discussed now.

In the first surface acoustic wave filter 100, the electrodes 107, 108, and 110, each having electrode fingers at the borders of the three IDTs 101, 102, and 103 are grounded. In the second surface acoustic wave filter 200 on the other hand, the electrode 206 having the electrode fingers at the borders of the three IDTs 201, 202, and 203 is connected to the signal terminal, while the electrodes 208 and 210 having the electrode fingers at the borders of the three IDTs 201, 202, and 203 are grounded.

No surface acoustic wave is excited at the borders of the IDTs in the first surface acoustic wave filter 100 because the electrode fingers are grounded at the borders. At the borders of the IDTs in the second surface acoustic wave filter 200, a surface acoustic wave is excited because the electrode fingers connected to the signal terminal and the grounded electrode fingers are arranged side by side.

The first surface acoustic wave filter 100 is different from the second surface acoustic wave filter 200 in that the number of electrode fingers connected to the signal terminal. Thus, the first surface acoustic wave filter 100 and second surface acoustic wave filter 200 have substantially different filter characteristics from each other.

A comparison of the insertion losses S21 and S31 for the balanced signal terminals 52 and 53 in the surface acoustic wave filter device 2R reveals a large difference in insertion loss (FIG. 19). The insertion loss S31 is smaller than the insertion loss S21 at or in the vicinity of 1830 MHz, leading to a degradation of the amplitude balance of the surface acoustic wave filter device 2R (see FIG. 20).

The surface acoustic wave filter device 2R produces a large insertion loss difference between the insertion losses S21 and S31 at and in the vicinity of 1830 MHz. In contrast, the surface acoustic wave filter device 2 includes the surface acoustic wave resonator 62, having a resonance frequency approximately equal to 1830 MHz, and connected to the balanced signal terminal 53 corresponding to the smaller insertion loss S31. By increasing the insertion loss S31 at or in the vicinity of 1830 MHz, the insertion losses S21 and S31 are similar to each other (see FIG. 3), and the amplitude balance is greatly improved (see FIG. 4).

As understood from the above discussion, the surface acoustic wave resonator 62 electrically connected in parallel with the balanced signal terminal 53 in the surface acoustic wave filter device 2 must have a quality factor Q less than a conventionally used surface acoustic wave resonator. If a surface acoustic wave resonator having a large quality factor Q is used, the insertion loss is excessively increased, which causes a degradation in the amplitude balance and causes a ripple in the transmission characteristics within the passband.

Design parameters affecting the quality factor Q include various factors, such as the number of IDT electrode fingers, interdigital width, number of reflectors, a metallization ratio of the IDT, thickness of Al, and material of the substrate. It is practically impossible to determine an optimum range for each of these parameters.

Figure 5:
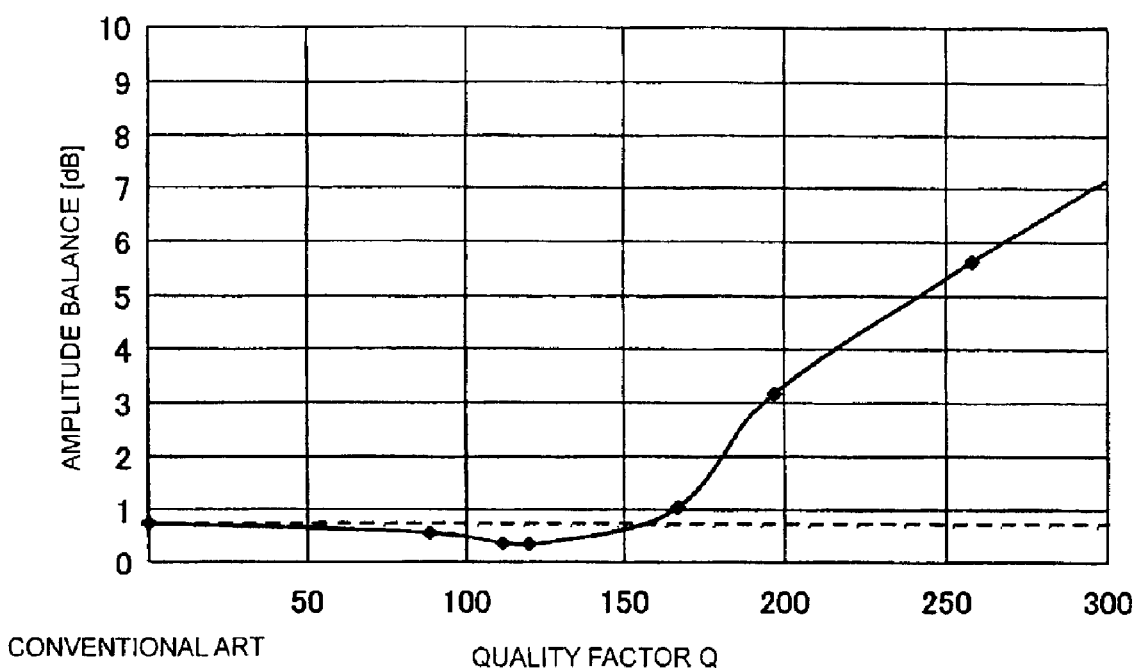
FIG. 5 is a graph plotting a relationship between a quality factor Q and an amplitude balance of the surface acoustic wave resonator in the surface acoustic wave filter device of FIG. 2.

Referring to FIG. 5, a variation in the amplitude balance of the quality factor Q of the parallel connected surface acoustic wave resonator is plotted and then an optimum range of the filter characteristics of the surface acoustic wave filter is defined by the quality factor Q. Specifically, a range of the quality factor Q which improves the amplitude balance is studied with reference to the surface acoustic wave filter device 2R having no parallel connected surface acoustic wave resonator. This study reveals that the amplitude balance is improved within a range of quality factor Q equal to or less than about 160. The amplitude balance is substantially improved when the quality factor Q of the surface acoustic wave resonator connected in parallel with at least one of the balanced signal terminals is equal to or less than about 160 in the surface acoustic wave filter.

Alternate Preferred Embodiments

Alternate preferred embodiments of the present invention will now be discussed with reference to FIGS. 6 through 15.

The number of surface acoustic wave resonators connected in parallel with the balanced signal terminal in the surface acoustic wave filter device of the present invention is not limited to only one. For example, a plurality of surface acoustic wave resonators 63 and 64 may be connected in parallel with the balanced signal terminal 53 in a surface acoustic wave filter device 3 (see FIG. 6), a plurality of surface acoustic wave resonators 65, 66, and 67 may be connected in parallel with the balanced signal terminal 53 in a surface acoustic wave filter device 4 (see FIG. 9), a serial connection of a plurality of surface acoustic wave resonators 68 and 69 may be connected in parallel with the balanced signal terminal 53 in a surface acoustic wave filter device 5 (see FIG. 12), and surface acoustic wave resonators 70 and 71 may be connected in parallel with the balanced signal terminal 53, and a surface acoustic wave resonator 72 may be connected in parallel with the balanced signal terminal 52 in a surface acoustic wave filter device 6 (see FIG. 13).

An overall quality factor Q of the plurality of surface acoustic wave resonators to be connected in parallel with the balanced signal terminal is preferably equal to or less than about 160. Each of the above alternate preferred embodiments provides the same advantages of the surface acoustic wave filter device 2.

Figure 6:
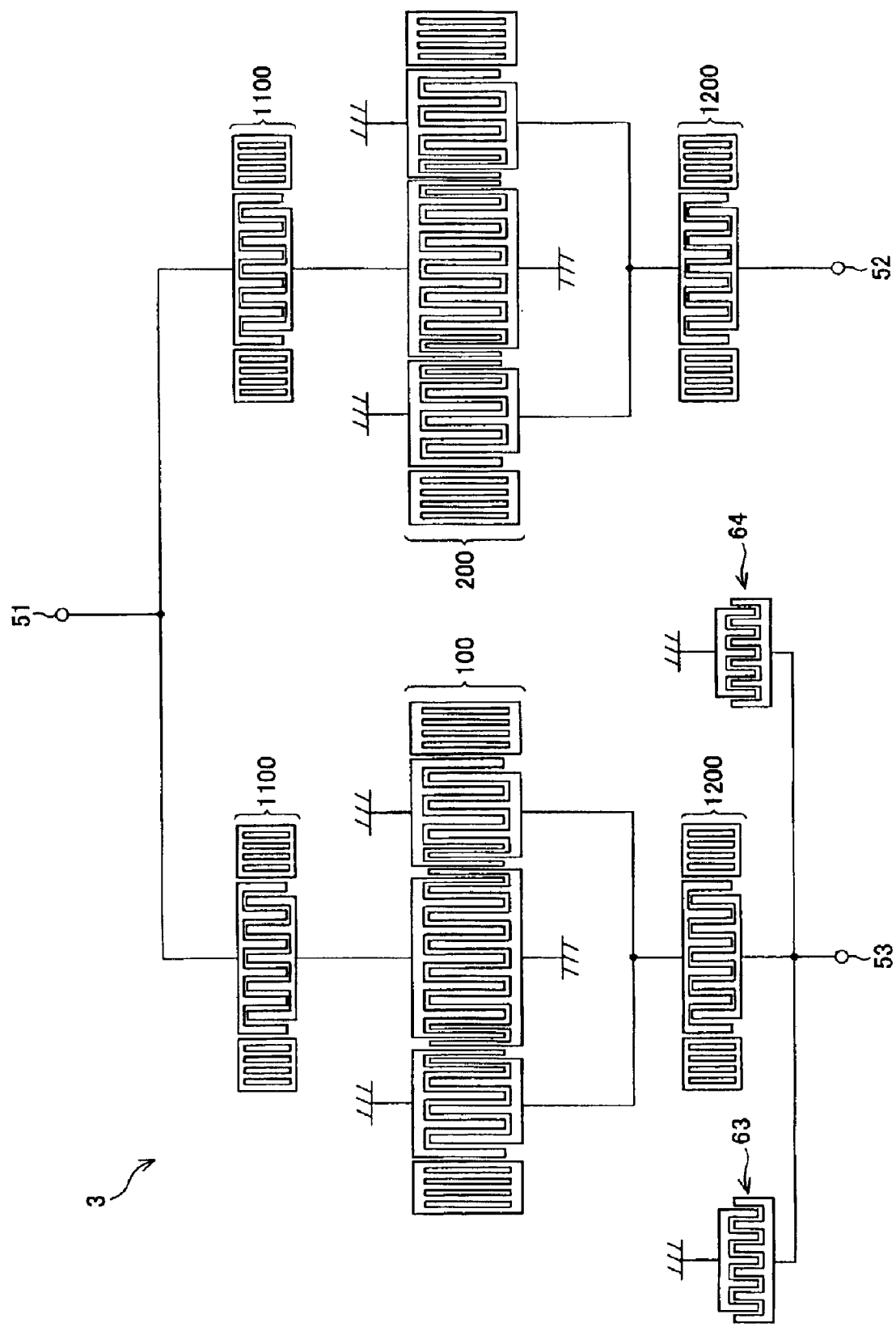
FIG. 6 is a plan view illustrating a surface acoustic wave filter device of an alternate preferred embodiment of the present invention.

Specifically, the surface acoustic wave filter device 3 shown in FIG. 6 includes the two surface acoustic wave resonators 63 and 64 which are additionally connected in parallel with the balanced signal terminal 53 in the surface acoustic wave filter device 2R (see FIG. 18) as a comparative example.

Examples of the design values of the surface acoustic wave filter device 3 are listed below. The electrodes of the surface acoustic wave filter device 3 other than the surface acoustic wave resonators 63 and 64 remain unchanged from those in the surface acoustic wave filter device 2.

Figure 9:
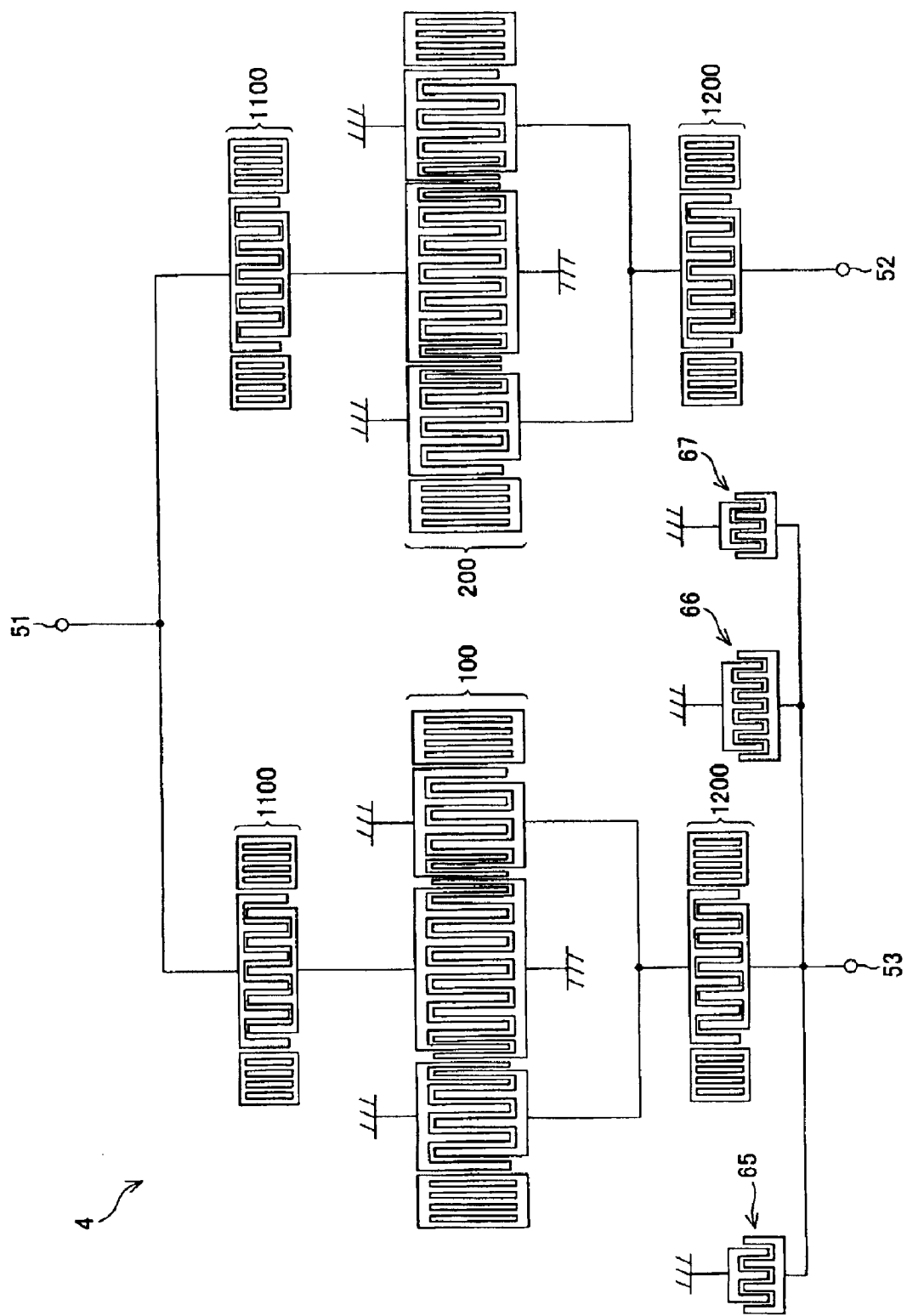
FIG. 9 is a plan view illustrating a surface acoustic wave filter device in accordance with another alternate preferred embodiment of the present invention.

(5) Surface Acoustic Wave Resonator 63
　Interdigital width W: about 2.4 $\lambda$I
　Number of pairs of electrodes in IDT: 10
　Wavelength of IDT $\lambda$I: about 2.12 $\mu$m
　Wavelength of reflector $\lambda$R: about 2.12 $\mu$m
　Number of electrodes of reflector: 0
　Duty factor of IDT: about 0.60
　Thickness of electrodes: about 0.097 $\lambda$I (6) Surface Acoustic Wave Resonator 64
　Interdigital width W: about 2.4 $\lambda$I
　Number of pairs of electrodes in IDT: 10
　Wavelength of IDT $\lambda$I: about 2.10 $\mu$m
　Wavelength of reflector $\lambda$R: about 2.10 $\mu$m
　Number of electrodes of reflector: 0
　Duty factor of IDT: about 0.60
　Thickness of electrodes: about 0.097 $\lambda$I The surface acoustic wave filter device 4 shown in FIG. 9 includes the three surface acoustic wave resonators 65, 66, and 67 which are additionally connected to in parallel with the balanced signal terminal 53 in the surface acoustic wave filter device 2R as the comparative example (see FIG. 18).

The design values of the surface acoustic wave filter device 4 are listed below. The electrodes of the surface acoustic wave filter device 4 other than the surface acoustic wave resonators 65, 66, and 67 remain unchanged from those in the surface acoustic wave filter device 2.

Figure 7:
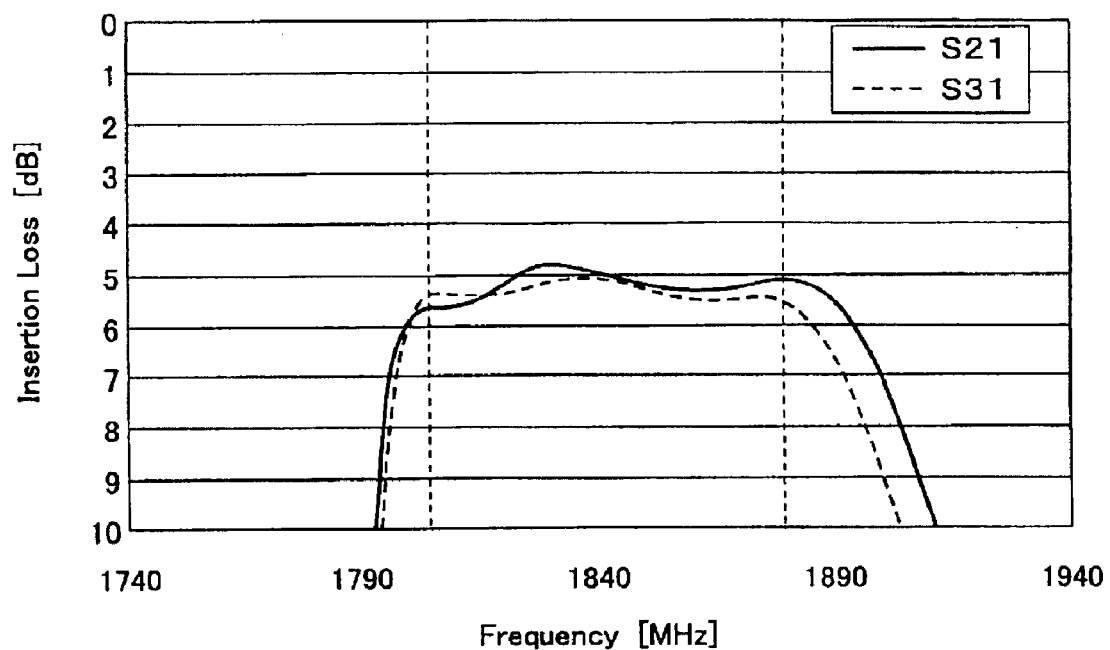
FIG. 7 is a graph plotting insertion losses at balanced signal terminals of the surface acoustic wave filter device of FIG. 6.
Figure 8:
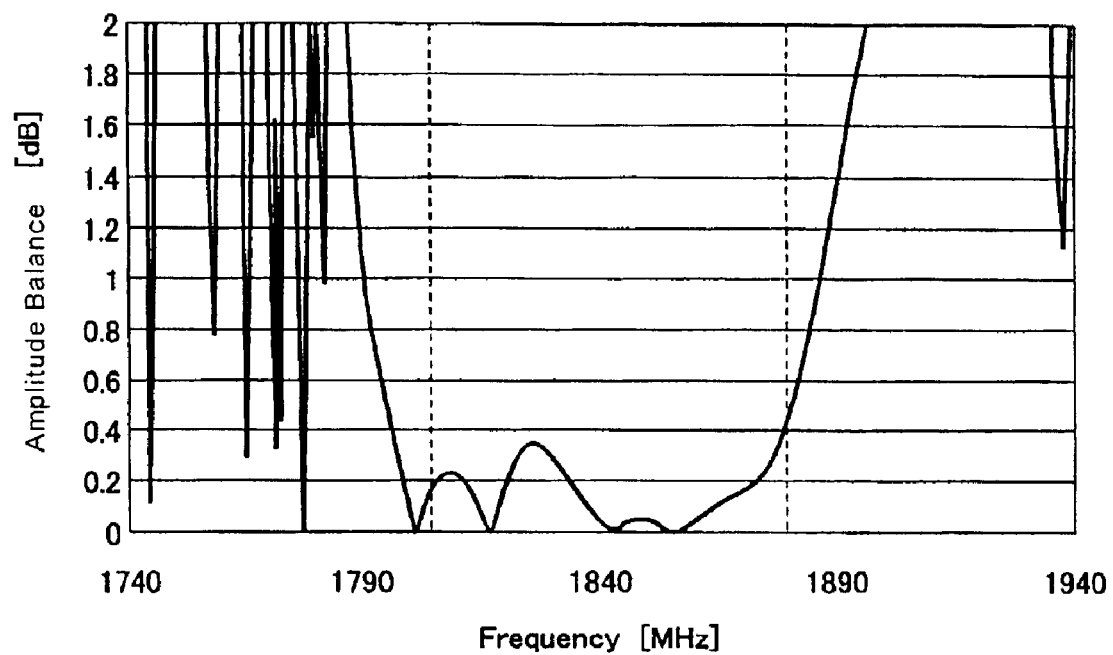
FIG. 8 is a graph plotting an amplitude balance of the surface acoustic wave filter device of FIG. 6.
Figure 10:
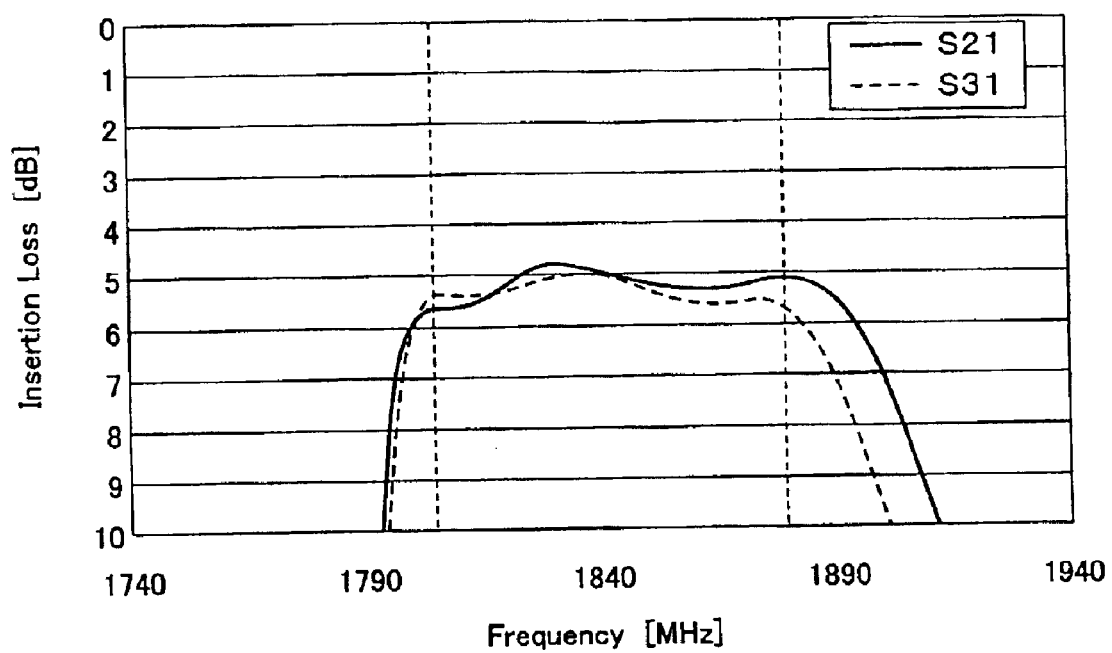
FIG. 10 is a graph plotting insertion losses at the balanced signal terminals of the surface acoustic wave filter device of FIG. 9.
Figure 11:
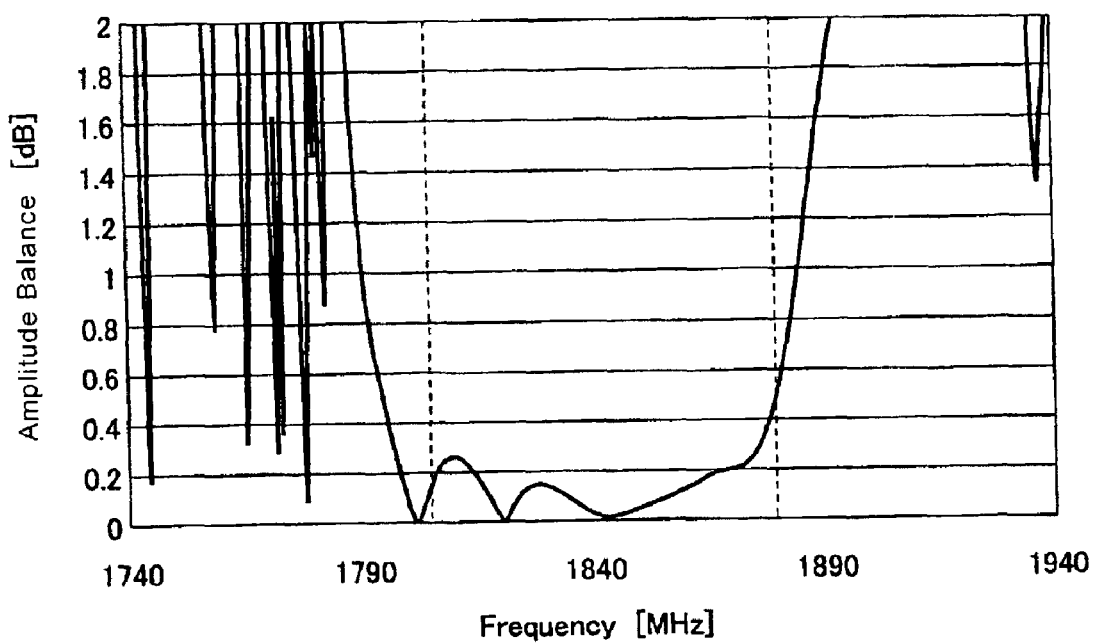
FIG. 11 is a graph plotting an amplitude balance of the surface acoustic wave filter device of FIG. 9.
Figure 12:
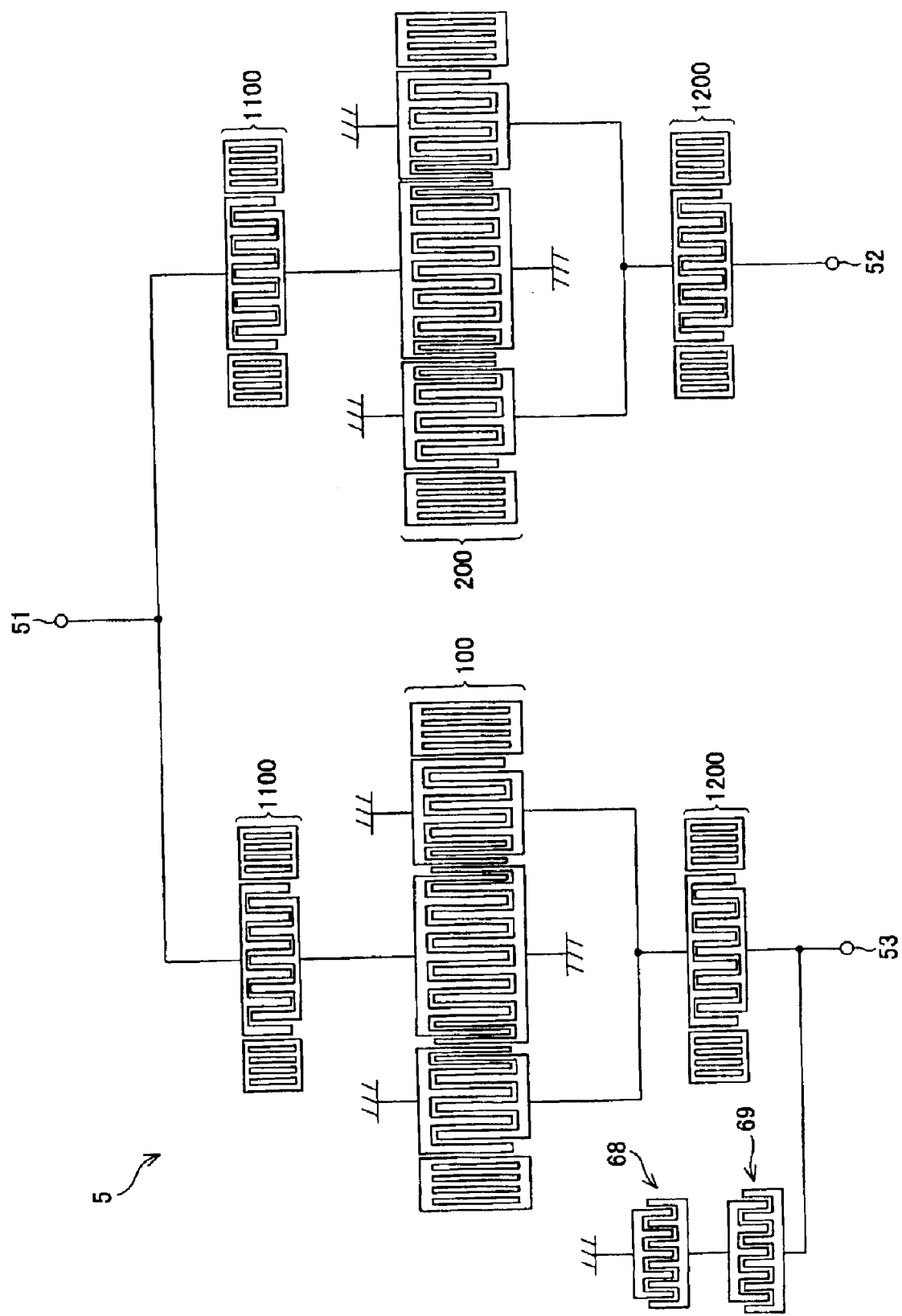
FIG. 12 is a plan view illustrating a surface acoustic wave filter device in accordance with yet another alternate preferred embodiment of the present invention.
Figure 13:
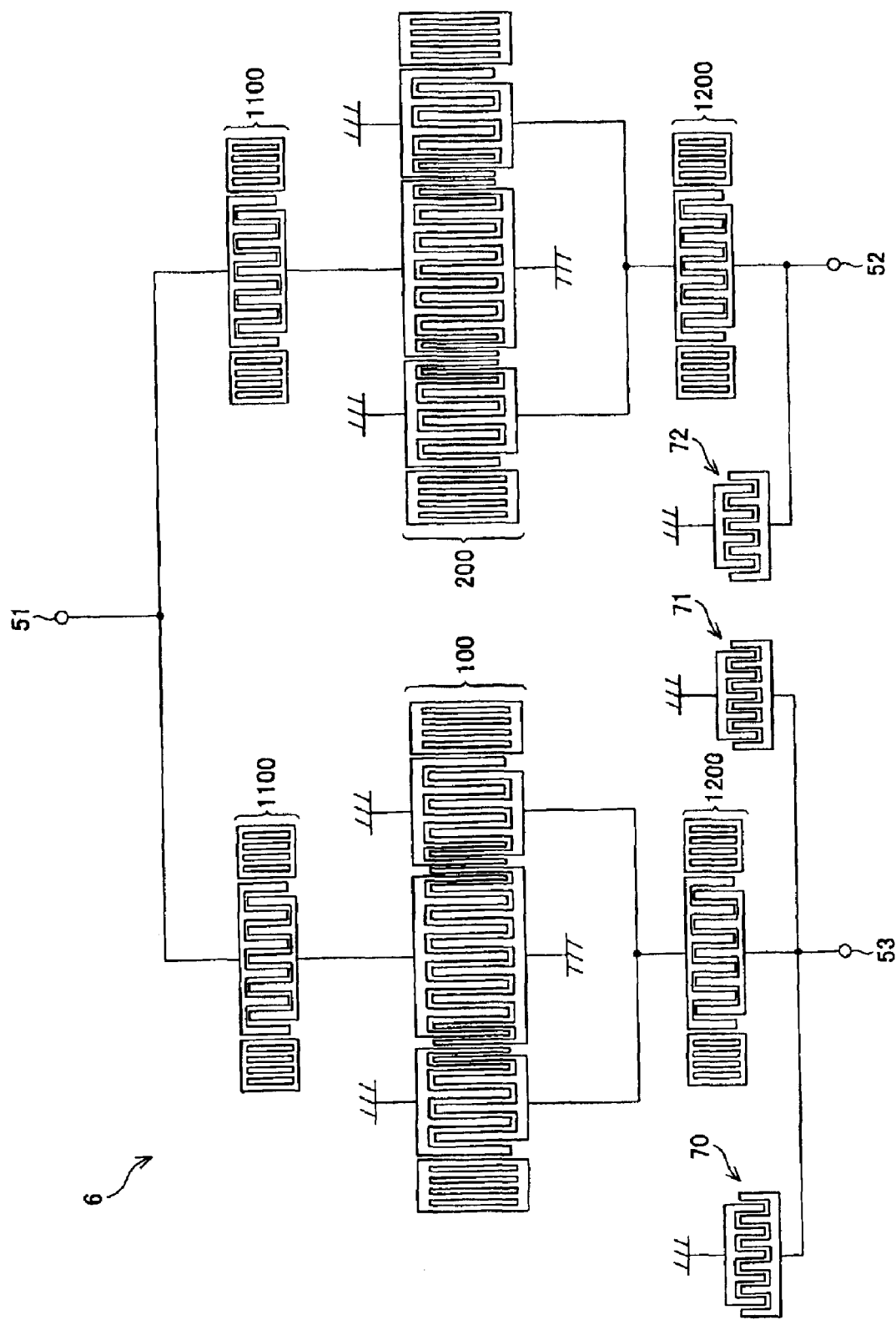
FIG. 13 is a plan view illustrating a surface acoustic wave filter device in accordance with a further alternate preferred embodiment of the present invention.
Figure 14:
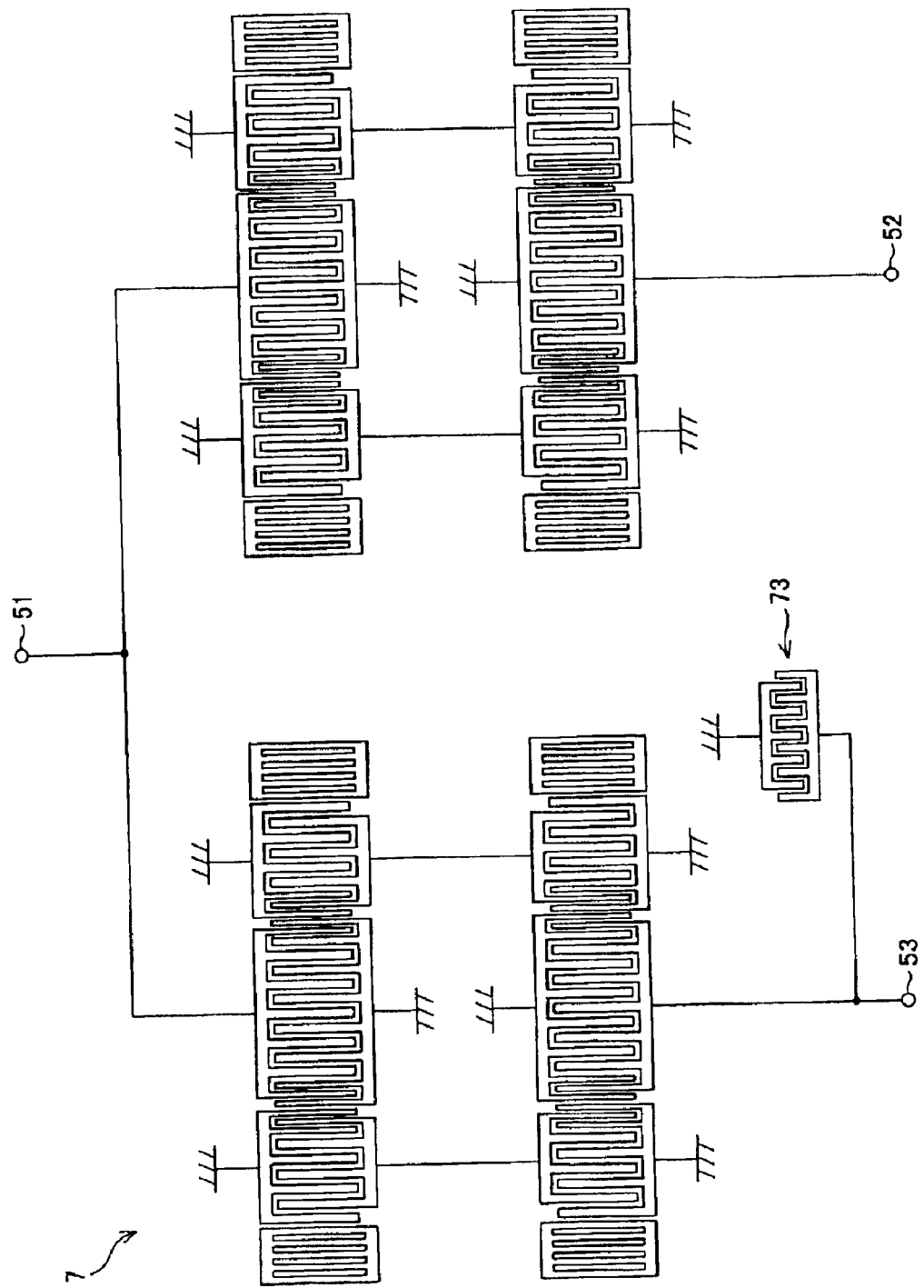
FIG. 14 is a plan view illustrating a surface acoustic wave filter device in accordance with a further alternate preferred embodiment of the present invention.
Figure 15:
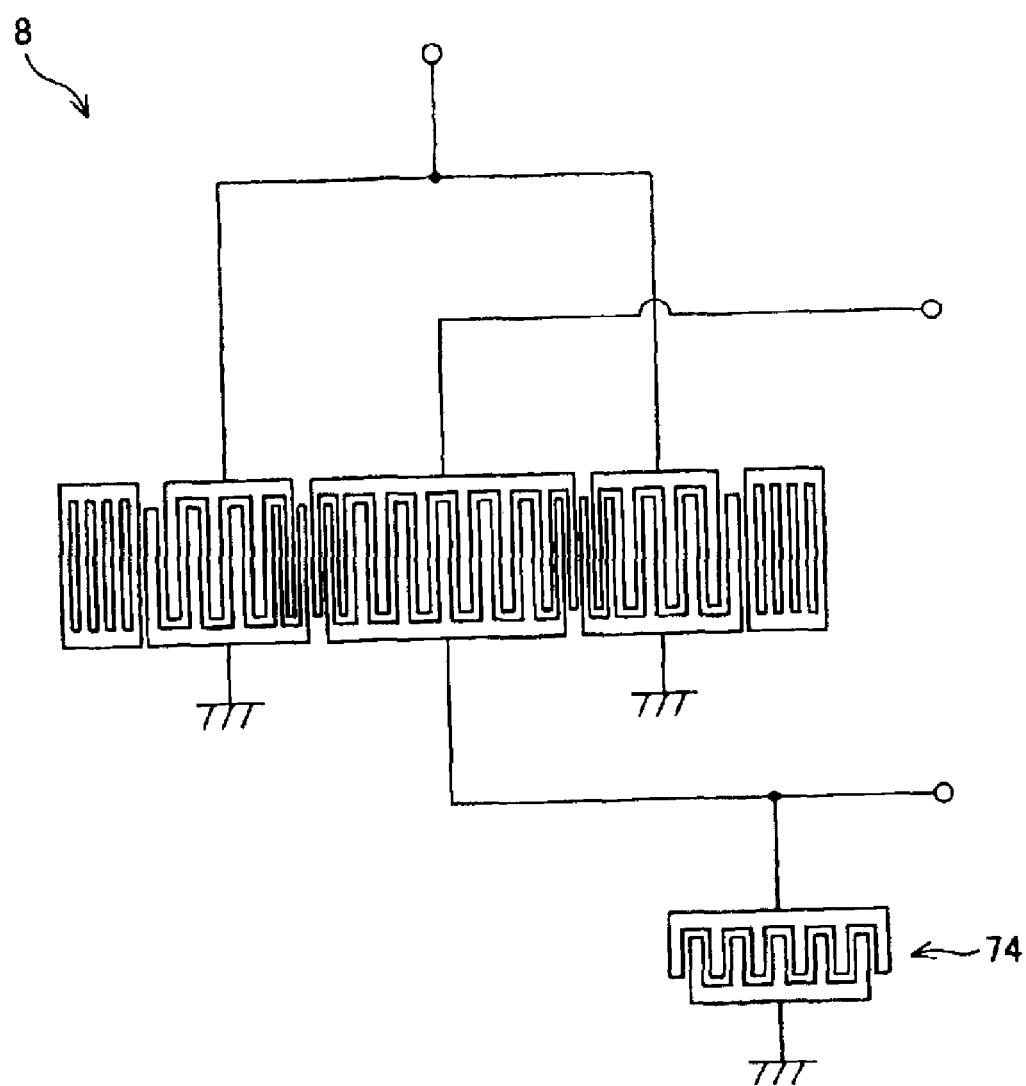
FIG. 15 is a plan view illustrating a surface acoustic wave filter device in accordance with a further alternate preferred embodiment of the present invention.

(7) Surface Acoustic Wave Resonator 65
　Interdigital width W: about 2.3 $\lambda$I
　Number of pairs of electrodes in IDT: 5
　Wavelength of IDT $\lambda$I: about 2.13 $\mu$m
　Wavelength of reflector $\lambda$R: about 2.13 $\mu$m
　Number of electrodes of reflector: 0
　Duty factor of IDT: about 0.60
　Thickness of electrodes: about 0.096 $\lambda$I (8) Surface Acoustic Wave Resonator 66
　Interdigital width W: about 2.4 $\lambda$I
　Number of pairs of electrodes in IDT: 10
　Wavelength of IDT $\lambda$I: about 2.11 $\mu$m
　Wavelength of reflector $\lambda$R: about 2.11 $\mu$m
　Number of electrodes of reflector: 0
　Duty factor of IDT: about 0.60
　Thickness of electrodes: about 0.097 $\lambda$I (9) Surface Acoustic Wave Resonator 67
　Interdigital width W: about 2.4 $\lambda$I
　Number of pairs of electrodes in IDT: 5
　Wavelength of IDT $\lambda$I: about 2.09 $\mu$m
　Wavelength of reflector $\lambda$R: about 2.09 $\mu$m
　Number of electrodes of reflector: 0
　Duty factor of IDT: about 0.60
　Thickness of electrodes: about 0.098 $\lambda$I FIGS. 7 and 8 are graphs respectively plotting insertion losses and amplitude balance at the balanced signal terminals of the surface acoustic wave filter device 3 having the above-described design values. FIGS. 10 and 11 are graphs respectively plotting insertion losses and amplitude balance at the balanced signal terminals of the surface acoustic wave filter device 4 having, the above-described design values,.

As seen from FIGS. 7 and 8, and FIGS. 10 and 11, the surface acoustic wave filter devices 3 and 4, similar to the surface acoustic wave filter device 2, provide a reduced difference between the insertion losses S21 and S31 at the balanced signal terminals within the passband as compared with the surface acoustic wave filter device 2R. The amplitude balance is thus greatly improved.

The surface acoustic wave filter device of the present invention is not limited to the one which includes the two serially coupled resonator type 3-IDT surface acoustic wave filters described above. To achieve desired frequency characteristics, the number IDTs, the number of filters, the interdigital width, and the number of electrodes for each IDT may be modified in the surface acoustic wave filter device of the present invention. The number of traps may be increased or decreased as necessary, and the trap itself may be modified. For example, a surface acoustic wave filter device 7 may include a surface acoustic wave resonator 73 which is connected to the balanced signal terminal 53 having the surface acoustic wave filter connected thereto (see FIG. 14). A surface acoustic wave filter device 8 may include a floating type surface acoustic wave resonator 78 connected in parallel (see FIG. 15). These surface acoustic wave filter devices provide the same advantages as the surface acoustic wave filter device 2.

In the above-described preferred embodiments, a 40±5° Y-cut, X-propagating LiTaO$_3$ substrate is used. Alternatively, another substrate such, as a 64–72° Y-cut, X-propagating LiNbO$_3$ substrate or a 41° Y-cut, X-propagating LiNbO$_3$ substrate, or other suitable substrate may be used.

The preferred embodiments of the present invention are not intended to limit the scope of the present invention. A variety of modifications and changes are possible within the scope of the present invention.

The surface acoustic wave filter device of the present invention includes balanced signal terminals, and at least one surface acoustic wave resonator connected in parallel to at least one of the balanced signal terminals. Specifically, at least one surface acoustic wave resonator is electrically connected in parallel with at least one of the balanced signal terminals of the surface acoustic wave filter having a balancing function.

Since the balances, particularly, the amplitude balance within the passband is improved, a surface acoustic wave filter device having an outstanding balance is obtained. The surface acoustic wave resonator is preferably also formed using the same photolithographic method by which the surface acoustic wave filter section is formed. The present invention eliminates the need for providing the impedance element in the surface acoustic wave filter device and the need for connecting an external impedance element to the surface acoustic wave filter device. The surface acoustic wave filter device of the present invention thus outperforms the conventional art in terms of costs and dimensions.

In the surface acoustic wave filter device, the resonance point of the parallel connected surface acoustic wave resonator is approximately equal to a frequency, at which the amplitude balance is deviated from an ideal value thereof, within the passband. Specifically, the frequency, at which the amplitude balance is deviated from the ideal value thereof, within the passband is set to be approximately equal to the resonance frequency of the surface acoustic wave resonator electrically connected in parallel.

If there is a difference between the insertion losses at the two balanced signal terminals in the surface acoustic wave filter device, the surface acoustic wave resonator is connected to the balanced signal terminals having a smaller insertion loss.

Preferably, the quality factor Q of the surface acoustic wave resonator is preferably about 160 or less.

The surface acoustic wave filter device may have the balanced-to-unbalanced line-coupling function.

The communication apparatus according to another preferred embodiment of the present invention includes the above-described surface acoustic wave filter device.

Figure 16:
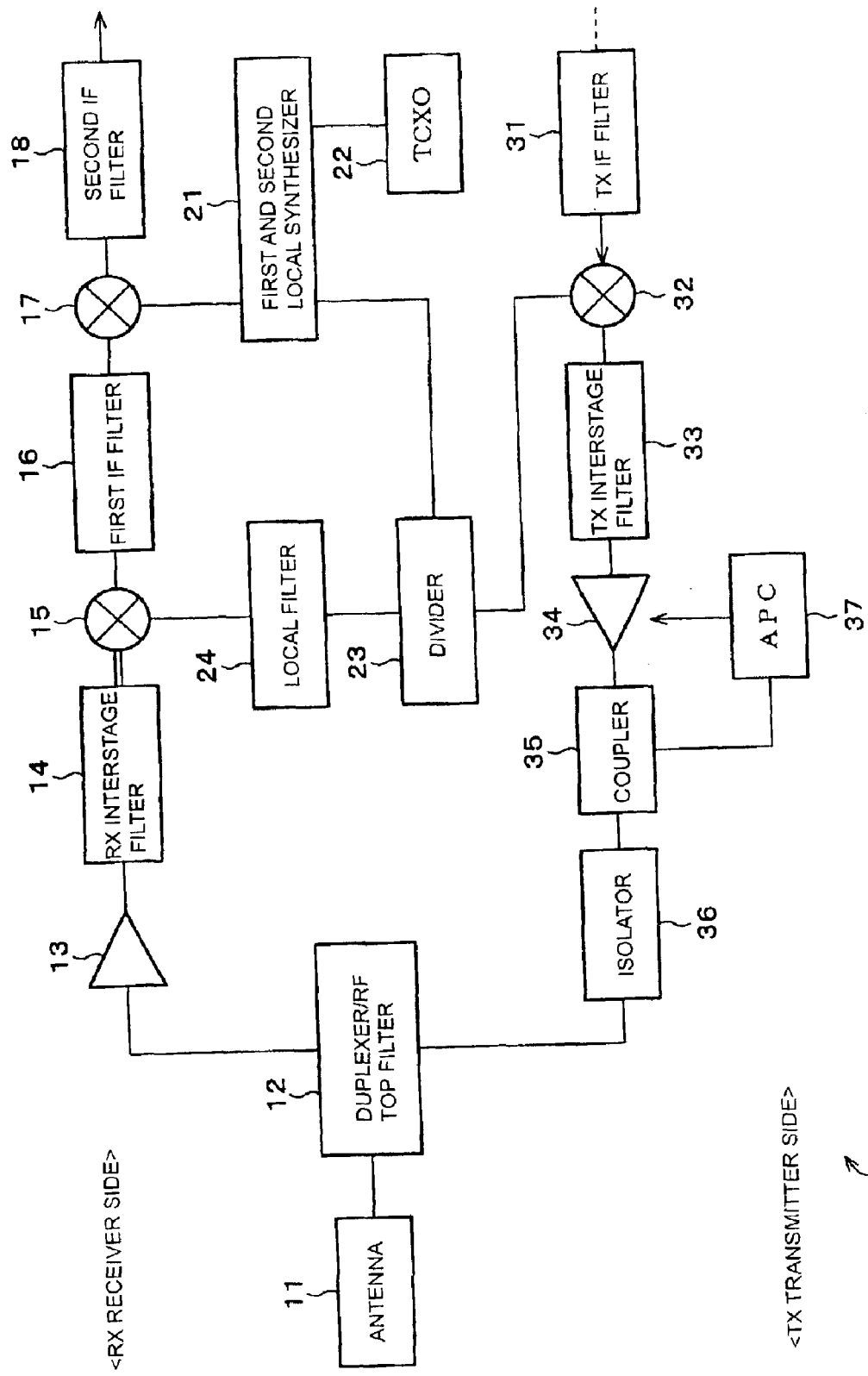
FIG. 16 is a block diagram illustrating a communication apparatus incorporating the surface acoustic wave filter device of the present invention.
Figure 17:
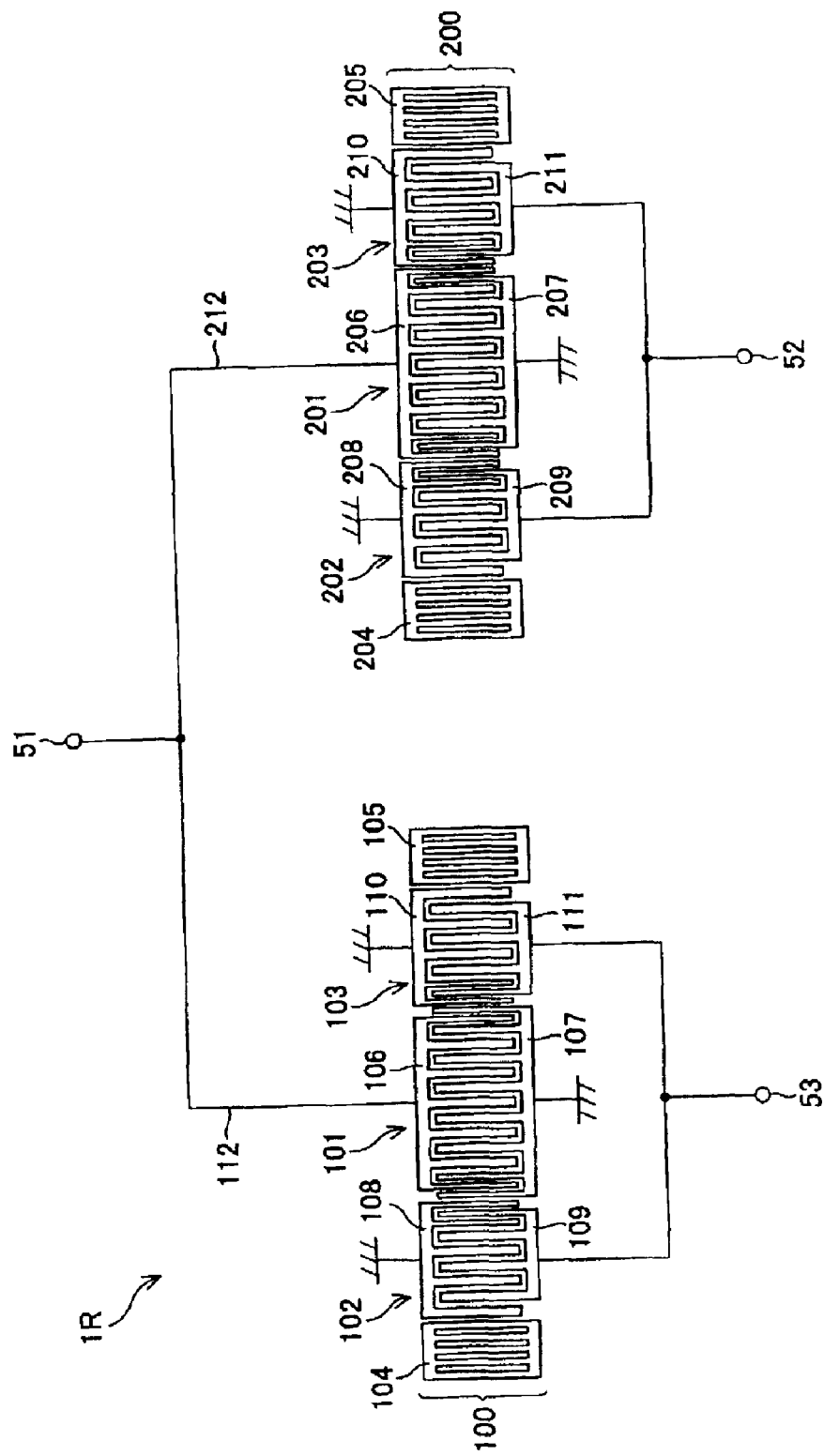
FIG. 17 is a plan view illustrating a conventional surface acoustic wave filter device.

A communication apparatus 10 including one of the surface acoustic wave filter devices 1 through 8 will now be discussed with reference to FIG. 16.

The communication apparatus 10 includes, in the receiver side thereof, an antenna 11, duplexer/RF top filter 12, amplifier 13, RX interstage filter 14, mixer 15, first IF filter 16, mixer 17, second IF filter 18, first and second local synthesizers 21, TCXO (Temperature Compensated Crystal Oscillator) 22, divider 23, and local filter 24. The transmitter side of the communication apparatus 10 shares the antenna 11 and duplexer/RF top filter 12 with the receiver side thereof, and further includes a TX IF filter 31, mixer 32, TX interstage filter 33, amplifier 34, coupler 35, isolator 36, and APC (Automatic Power Control) 37. A signal conducted between the RX interstage filter 14 and mixer 15 is preferably balanced.

Each of the surface acoustic wave filter devices 1 through 8 are appropriate for use in the above-mentioned duplexer/RF top filter 12, RX interstage filter 14, first IF filter 16, TX IF filter 31, and TX interstage filter 33.

As already discussed in connection with the surface acoustic wave filter devices 1 through 8, the surface acoustic wave resonator is provided on the piezoelectric substrate to reduce the difference between the insertion losses to improve the amplitude balance. Thus, it is not necessary to provide the impedance element in the surface acoustic wave filter or to connect an external impedance element to the surface acoustic wave filter in the communication apparatus. The surface acoustic wave resonator is formed with the same photolithographic method by which the surface acoustic wave filter section is formed. Thus, the surface acoustic wave filter device of the present invention thus outperforms the conventional art in terms of costs and dimensions. With one of the surface acoustic wave filter devices 1 through 8 included in the communication apparatus, the communication apparatus 10 is compact and low-cost and has outstanding filter characteristics.

The communication apparatus 10 is appropriate for use as an apparatus working on the DCS, GSM, or PCS, for example.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
   balanced signal terminals;
   a surface acoustic wave filter connected to the balanced signal terminals; and
   at least one surface acoustic wave resonator connected in parallel between at least one of the balanced signal terminals;
   and a ground terminal, such that one end of the at least one surface acoustic wave resonator is connected to the ground terminal and the other end of the at least one surface acoustic wave resonator is connected to a signal line which connects the at least one surface acoustic wave filter and the balanced signal terminal.

2. A surface acoustic wave device according to claim 1, wherein a resonance point of the at least one surface acoustic wave resonator falls within a passband of the surface acoustic wave filter.

3. A surface acoustic wave device according to claim 2, wherein the resonance point of the at least one surface acoustic wave resonator is substantially equal to or in the vicinity of a frequency at which an amplitude balance of the surface acoustic wave filter is deviated from an ideal value thereof, within the passband of the surface acoustic wave filter.

4. A surface acoustic wave device according to claim 1, wherein the at least one surface acoustic wave resonator is connected to one of the balanced signal terminals having a smaller insertion loss than the other balanced signal terminals.

5. A surface acoustic wave device according to claim 1, wherein a quality factor Q of the at least one surface acoustic wave resonator is about 160 or less.

6. A surface acoustic wave device according to claim 1, wherein the surface acoustic wave device includes a balance-unbalance converting function.

7. A surface acoustic wave device according to claim 1, wherein the surface acoustic wave filter includes three interdigital transducers and reflectors which sandwich said three interdigital transducers.

8. A surface acoustic wave device according to claim 1, wherein said surface acoustic wave filter is made of aluminum.

9. A surface acoustic wave device according to claim 7, wherein each of the three interdigital transducers includes a plurality of electrode fingers arranged such that a pitch of several electrode fingers of the plurality of electrode fingers of each of the interdigital transducers is narrower where the interdigital transducers are adjacent to each other than the remaining electrode fingers of the plurality of electrode fingers.

10. A communication apparatus comprising a surface acoustic wave device according to claim 1.

* * * * *